(12) United States Patent
Curcio et al.

(10) Patent No.: US 6,452,117 B2
(45) Date of Patent: Sep. 17, 2002

(54) METHOD FOR FILLING HIGH ASPECT RATIO VIA HOLES IN ELECTRONIC SUBSTRATES AND THE RESULTING HOLES

(75) Inventors: Brian Eugene Curcio, Binghamton, NY (US); Peter Alfred Gruber, Mohegan Lake, NY (US); Frederic Maurer, Valhalla, NY (US); Konstantinos I. Papathomas, Endicott, NY (US); Mark David Poliks, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/871,555

(22) Filed: May 31, 2001

Related U.S. Application Data

(63) Continuation-in-part of application No. 09/383,325, filed on Aug. 26, 1999.

(51) Int. Cl.⁷ .......................... H01R 12/04; H05K 1/11
(52) U.S. Cl. ...................... 174/262; 174/260; 174/263; 174/264; 174/266; 361/760; 361/795; 361/803; 439/65; 257/698; 257/778; 257/737
(58) Field of Search .................. 174/262, 263, 174/264, 266, 255, 260; 361/792, 793, 794, 795, 803, 760; 439/65, 66; 257/698, 777, 778, 737

(56) References Cited

U.S. PATENT DOCUMENTS

| | | | |
|---|---|---|---|
| 5,627,345 A | | 5/1967 | Yamamoto et al. |
| 4,131,516 A | | 12/1978 | Bakos et al. |
| 4,383,363 A | * | 5/1983 | Hayakawa et al. ............ 29/847 |
| 4,394,712 A | * | 7/1983 | Anthony ....................... 361/779 |
| 4,547,836 A | * | 10/1985 | Anthony ....................... 361/783 |
| 4,830,264 A | | 5/1989 | Bitaillou et al. |
| 5,243,142 A | * | 9/1993 | Ishikawa et al. ............. 174/262 |
| 5,244,143 A | | 9/1993 | Ference et al. |
| 5,259,110 A | | 11/1993 | Bross et al. |
| 5,319,159 A | * | 6/1994 | Watanabe et al. ............ 174/262 |
| 5,436,062 A | * | 7/1995 | Schmidt et al. .............. 428/209 |
| 5,473,120 A | | 12/1995 | Ito et al. |
| 5,487,218 A | | 1/1996 | Bhatt et al. |
| 5,515,604 A | * | 5/1996 | Horine et al. .................. 29/830 |
| 5,557,844 A | | 9/1996 | Bhatt et al. |
| 5,576,052 A | * | 11/1996 | Arledge et al. ................ 427/98 |
| 5,965,043 A | * | 10/1999 | Noddin et al. .......... 219/121.71 |
| 6,056,191 A | | 5/2000 | Brouillette et al. |
| 6,198,168 B1 | * | 3/2001 | Geusic et al. ................ 257/774 |

FOREIGN PATENT DOCUMENTS

DE 37 28 151 A1 8/1987

OTHER PUBLICATIONS

"IMS– Injection Molded Soldering", David Danovitch and Peter A. Gruber (5 pp.).

* cited by examiner

*Primary Examiner*—David L. Talbott
*Assistant Examiner*—J B Patel
(74) *Attorney, Agent, or Firm*—William N. Hogg

(57) ABSTRACT

High aspect ratio (5:1–30:1) and small (5 μm–125 μm) diameter holes in a dielectric substrate are provided, which are filled with a solidified conductive material, as well as a method of filling such holes using pressure and vacuum. In certain embodiments, the holes are lined with conductive material and/or capped with a conductive material. The invention also contemplates a chip carrier formed by such material.

13 Claims, 11 Drawing Sheets

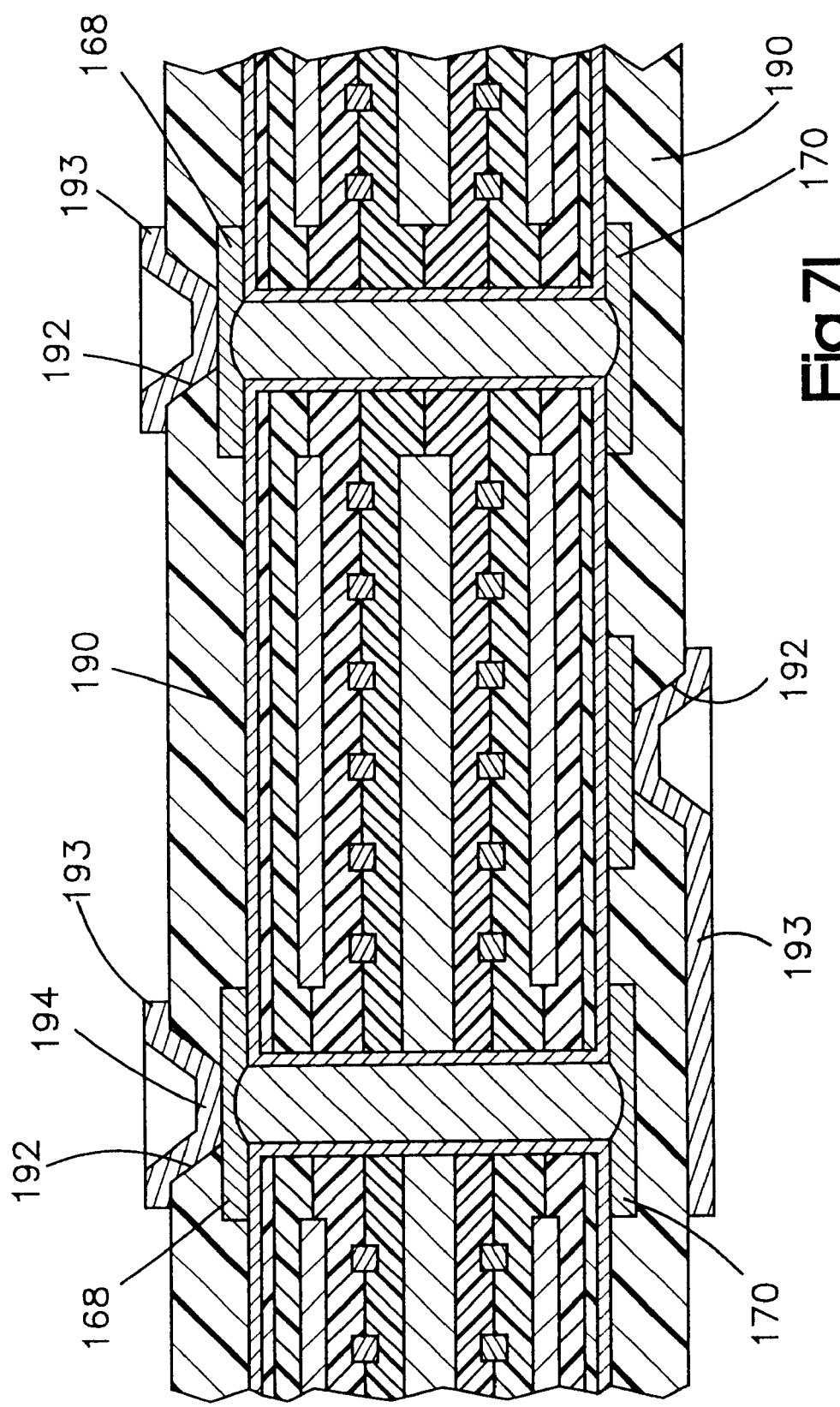

METHOD FOR FILLING HIGH ASPECT RATIO VIA HOLES IN ELECTRONIC SUBSTRATES AND THE RESULTING HOLES

RELATED APPLICATION

This application is a continuation in part of application Ser. No. 09/383,325, filed Aug. 26, 1999, for APPARATUS AND METHOD FOR FILLING HIGH ASPECT RATIO VIA HOLES IN ELECTRONIC SUBSTRATES.

FIELD OF THE INVENTION

The present invention generally relates to a method for filling holes in a substrate and such resulting holes and, more particularly, relates to a method for filling holes in electronic substrates that have high aspect ratios of at least 5:1 in a process for forming vias and interconnects and the resulting holes and vias.

BACKGROUND OF THE INVENTION

In the electronics packaging industry, there is often a need to fill holes in various substrates for forming vias and interconnects. One such use is for a high performance chip carriers having high small diameter aspect ratio holes. The hole filling process is affected by a number of processing and material parameters, for instance, the diameter of the via hole, the depth of the hole and the type of the substrate material, etc. Typically, via holes are through holes and are used to electrically connect a top surface and a bottom surface of a substrate and, thus, the filler material utilized in forming the vias must be electrically conductive. A number of techniques have been used to perform the via hole filling process. Depending on the type of the substrate, the techniques may include electroplating, electroless plating, solder paste screen printing and conductive paste screen printing.

A fundamental processing problem arises when the depth-to-width ratio, or the aspect ratio grows., The problem gets more complex when the hole diameter is made aggressively small, i.e., 125 $\mu$m or less. For instance, for holes having depth-to-width aspect ratios of 5:1 or larger, and the hole diameter is less than about 125 $\mu$m, it is no longer possible to use a conventional technique such as paste screening to fill the holes. Even the more advanced plating techniques cannot be used alone when diameters further decrease and aspect ratios further increase.

An attempt to fill via holes that have 17:1 aspect ratio with conductive epoxies by a screen printing method was found ineffective, even when the screening process is conducted from both the top and the bottom side of the substrate. One other attempt to fill a glass substrate that has via holes of 17:1 aspect ratio was carried out by utilizing a conductive material that has extremely low viscosity, i.e., an eutectic solder that has a viscosity of only 2 centipoise in its molten state, approaching that of water. Even at such low viscosity, known techniques for filling the high aspect ratio via holes were found ineffective. For instance, the conventional techniques tried include an injection molded solder technique with only pressure utilized. The injection molded solder technique was not able to fill deep vias holes that have very small diameters, i.e., smaller than 25 $\mu$m.

A second technique of vacuum injection molding was also tried. A graphic illustration of the vacuum injection molding process is shown in FIGS. 1A~1D. The vacuum injection molding process was disclosed in a co-pending application that was assigned to the common assignee of the present invention under Ser. No. 08/518,874. The vacuum injection molding method utilizes a pressure differential formed between either ambient and vacuum or positive pressure and vacuum. The pressure and the vacuum are both supplied on the same surface of a substrate 10, as shown in FIG. 1A. The process is carried out by utilizing a shallow vacuum link 12 that allows a continual evacuation of air from via holes 20 that have a large aspect ratio such as 5:1. The vacuum link 12 must be sufficiently shallow such that the surface tension of molten solder prevents cross-leaking during the operation. Such a shallow link 12 effectively choke a significant part of the full pressure differential and thus producing only partial filling of via holes 20 that have high aspect ratios.

As shown in FIG. 1A, an injection head 14 which includes spaced apart vacuum slot 16 and injection slot 22 is positioned on top of a mold plate, or substrate 10 in fluid communication with the mold cavities, or via holes 20 contained therein. Relative axial sliding is effected between the injection head 14 and the mold plate 10 for sequentially evacuating gas from the mold cavities 20 using a continuous vacuum and injecting into the evacuated mold cavities 20 a liquid fed from a continuous source (not shown). The sliding of the injection head 14 over the mold plate 10, as shown in FIGS. 1B and 1C, automatically provides self valving for sequentially evacuating and filling the mold cavities 20 from the same side, i.e., the top side 18 of the mold plate 10. In a preferred embodiment, the vacuum slot 16 and the injection slot 22 are linked together at the mold plate 10 so that surface tension of the liquid restrains flow of the liquid (not shown) from the injection slot 22 to the vacuum slot 16 while allowing gas flow thereinbetween for effecting vacuum in the mold cavities 20.

As shown in FIG. 1A, at the start of the process, i.e., before scanning begins, the mold cavities 20 are empty. As the scanning process begins, as shown in FIG. 1B, some cavities 24 are evacuated. As the scanning of the injection head 14 continues, some cavities 26 are filled with the liquid. In the final step of the process, as shown in FIG. 1D, the vacuum supply to the vacuum slot 16 is turned off while the scanning of the injection head 14 is completed, i.e., all the cavities 20, 24 and 26 are filled with liquid.

The vacuum injection molding method illustrated in FIGS. 1A~1D applies a vacuum and a liquid injection on the same surface of tst be used to allow the continual evacuation of air from mold cavities that have a larger aspect ratio such as 5:1. The drawback of the process is that the vacuum link must be sufficiently shallow such that the surface tension of molten solder prevents cross-leaking during the operation. The shallow link chokes off a significant part of the full pressure differential and thus only produces partial filling of the mold cavities, or the via holes that have high aspect ratios.

It is an object of the present invention to provide high aspect ratio filled via holes in an electronic substrate and a method of forming certain of these filled holes.

SUMMARY OF THE INVENTION

In accordance with the present invention, high aspect ratio filled via holes in electronic substrates are provided, as well as a method of forming certain of these holes.

In a preferred embodiment, an apparatus for filling a liquid in high aspect ratio holes in a substrate is provided which includes a filler plate adapted for receiving an injection head therein, the filler plate has a bottom surface adapted for receiving an injection slot provided on the injection head, a vacuum plate adapted for receiving a vacuum slot in a top surface, the vacuum slot is in fluid communication with a vacuum source, and a connection means for connecting the filler plate and the vacuum plate together in a face-to-face, spaced-apart relationship forming a gap therebetween with the bottom surface of the filler plate positioned parallel and opposite to the top surface of the vacuum plate, the connection means further includes an adjustment means for adjusting a relative axial position of the filler plate to the vacuum plate, the gap formed between the filler plate and the vacuum plate is sufficiently large to slidingly engaging a substrate therein and to form abutting contacts between the substrate and the bottom surface of the filler plate and between the substrate and the top surface of the vacuum plate so that holes in the substrate are first evacuated by the vacuum slot and then filled with a liquid by the injection slot in the filler plate.

In the apparatus for filling a liquid in high aspect ratio holes in a substrate, the adjustment means may include a veneer adjustment for fixing a relative axial position of the filler plate to the vacuum plate. The adjustment means may further include a veneer adjustment for transforming a circumferential displacement into a linear axial displacement. The filler plate may be positioned by the adjustment means to lag behind the vacuum plate such that the injection slot lags behind the vacuum slot. The filler plate may be positioned by the adjustment means at the same axial position of the vacuum plate such that the injection slot and the vacuum slot are in fluid communication with a hole in the substrate simultaneously.

In the apparatus for filling a liquid in high aspect ratio holes in a substrate, the injection slot may have a width sufficiently large to cover substantially all the high aspect ratio holes in the substrate. The injection head may be in fluid communication with a liquid reservoir for feeding a liquid through the injection slot. The injection slot may be adapted for feeding a high electrical conductivity liquid solder therethrough. The connection means may further include an adjustment means of a threaded veneer mechanically attached to the filler plate and at least one engagement pin connecting the threaded veneer to the vacuum plate. The high aspect ratio holes in the substrate are selected from the group consisting of via holes, deep through holes and deep trenches.

In the apparatus for filling a liquid in high aspect ratio holes in an electronic substrate, the high aspect ratio holes may have an aspect ratio of at least 5:1, or an aspect ratio of at least 20:1. The high aspect ratio holes may have a diameter not smaller than 5 82 m. The electronic substrate may be adapted for making sliding movement between the filler plate and the vacuum plate at a speed of between about 25 mm/min and about 250 mm/min. The apparatus may further include a drive means slidingly engaging the substrate between the filler plate and the vacuum plate.

The present invention is further directed to a method for filling a liquid into holes that have aspect ratios of larger than 5:1 in a substrate which can be carried out by the operating steps of providing a substrate that is equipped with a plurality of through holes that have aspect ratios of larger than 5:1, each of the plurality of through holes has a first opening on a first surface of the substrate and a second opening on an opposite second surface of the substrate, contacting the first surface of the substrate with a vacuum plate equipped with a vacuum slot such that air is evacuated from the first opening of each of the plurality of through holes, and contacting the second surface of the substrate with a filler plate equipped with an injection slot such that a liquid can be injected into the second opening of each of the plurality of through holes which was evacuated by the vacuum plate. The method also includes forming a conductive cap on the filled hole, or forming a conductive lining in each hole, or both.

The method for filling a liquid into holes that have aspect ratios of larger than 5:1 in a substrate may further include the step of contacting the first surface of the substrate with a vacuum plate and contacting the second surface of the substrate with a filler plate simultaneously. The method may further include the step of connecting the vacuum plate to the filler plate by a connection means which further includes an adjustment means of a veneer adjuster. The method may further include the step of adjusting the veneer adjuster such that the injection slot lags behind the vacuum slot when a substrate is slidingly displaced inbetween the filler plate and the vacuum plate. The method may further include the step of slidingly engaging a substrate between the filler plate and the vacuum plate, or slidingly moving a substrate inbetween the filler plate and the vacuum plate by a motor means, or the step of slidingly moving the substrate inbetween the filler plate and the vacuum plate at a speed between about 25 mm/min and about 250 mm/min.

The method for filling a liquid into high aspect ratio holes in a substrate may further include the step of covering substantially all the through holes in the substrate by the injection slots situated in the filler plate when the substrate is placed between the filler plate and the vacuum plate. The method may further include the step of connecting the vacuum plate to the filler plate in such a way that the vacuum plate is situated below the filler plate. The method may further include the step of providing a pressurized liquid reservoir in fluid communication with the injection slot, or the step of feeding a liquid to the injection slot in the filler plate from a liquid reservoir.

The method may further include the steps of feeding a molten solder in a liquid form to the injection slot in the filler plate, injecting the molten solder into the through holes, and solidifying the molten solder and forming via contacts. The method may further include the step of connecting a vacuum evacuation source to the vacuum slot in the vacuum plate such that air is evacuated from the first opening of each of the plurality of through holes.

There is also shown an apparatus for filling an electrically conductive material into high aspect ratio holes in an electronic substrate which includes a first plate equipped with an injection slot for delivering an electrically conductive material, a second plate equipped with a vacuum slot for evacuating air, means for fixing the first and second plates together in a parallely face-to-face, spaced-apart relationship forming a dispensing unit for intimately engaging an electronic substrate therein, the electronic substrate may have holes with aspect ratios larger than 5:1 therein and the holes are in fluid communication with the injection slot and the vacuum slot when intimately engaged between the first and second plates, and drive means for causing sliding engagement and relative motion between the dispensing unit and an electronic substrate positioned therein.

In the apparatus for filling an electrically conductive material into high aspect ratio holes, the apparatus may further include an electrically conductive material reservoir for feeding the material into the injection slot. The apparatus may further include vacuum evacuation means for withdrawing air from the vacuum slot. The fixing means may further include adjustment means for adjusting a relative position of the first plate to the second plate, the adjustment means may be a veneer adjuster. The injection slot in the first plate may be adjusted behind the vacuum slot in the second plate, or the injection slot in the first plate may be adjusted to the same axial position of the vacuum slot in the second plate. The electrically conductive material delivered may be a molten solder at the lower end of the viscosity range, or a conductive polymer at the higher end of the viscosity range. The drive means drives the electronic substrate and cause it to slide between the first and second plates. The drive means may be a motor means.

The invention also contemplates a filled hole having an aspect ratio of greater than 5:1 and a diameter of less than about 125 μm.

Also contemplated is a filled hole which may be plated with a conductor, and having a conductive cap, or both, and a method of forming such a hole.

BRIEF DESCRIPTION OF THE DRAWINGS

These and other objects, features and advantages of the present invention will become apparent from the following detailed description and the appended drawings in which:

FIG. 7I shows another embodiment of the chip carrier.

DETAILED DESCRIPTION OF THE PREFERRED EMBODIMENT

An apparatus and a method for filling high aspect ratio holes in electronic substrates, which can be advantageously used for forming via contacts, interconnects or trenches in various electronic structures including but not limited to substrates for display panels, is shown.

Also provided are structures formed by the present method and apparatus which have high aspect ratio through holes filled with a conductive material such as a conductive polymer or a eutectic solder for providing electrical communication in an insulating substrate.

The method may be advantageously used to fill deep, high aspect ratio through holes such as those having aspect ratios of larger than 5:1, or larger than 20:1. The present invention novel method can further be used to fill holes with diameters less than about 125 μm, as small as 10 μm, or as small as 5 μm. In the conventional method, through holes having diameters of smaller than 125 μm are difficult to fill with a conductive material for forming vias or interconnects.

The method provides for injecting an electrically conductive material into via or interconnect holes that have very high aspect ratios. The method is a dry processing technique and therefore retains the advantages of low-cost methods such as paste screening. The method is able to fill via holes that have diameters of 10 μm or larger and aspect ratios of 5:1 or larger. The method is made possible by utilizing several features such that reliable filling of very deep via or interconnect holes can be achieved. These features include the use of a large pressure differential between a filler material supply and the via holes, positive pressure from the top of the via holes fed from a filler reservoir and a vacuum from the bottom of the via holes from an evacuation means, an adjustable veneer position arranged between the pressurized supply and vacuum to accommodate various filler viscosities, and a scanning fill method to accommodate a wide range of via hole array sizes and to ensure fill control.

Figure 1A:
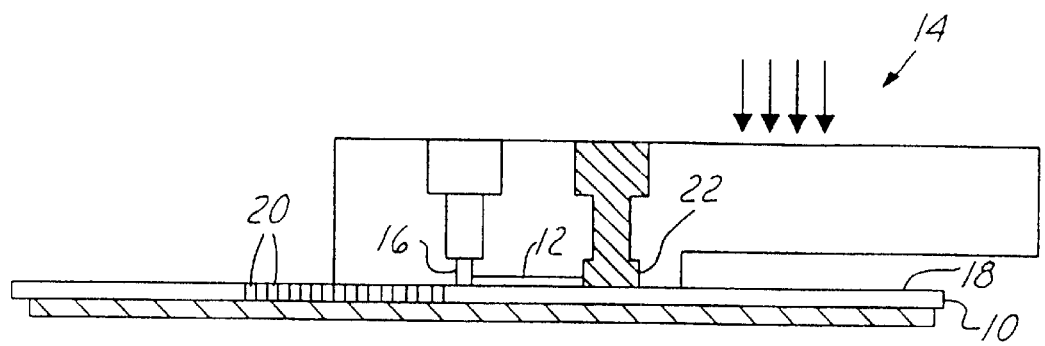
FIGS. 1A–1D are graphs illustrating a vacuum injection molding process wherein a vacuum head and an injection head are mounted on the same surface of a substrate.
Figure 1B:
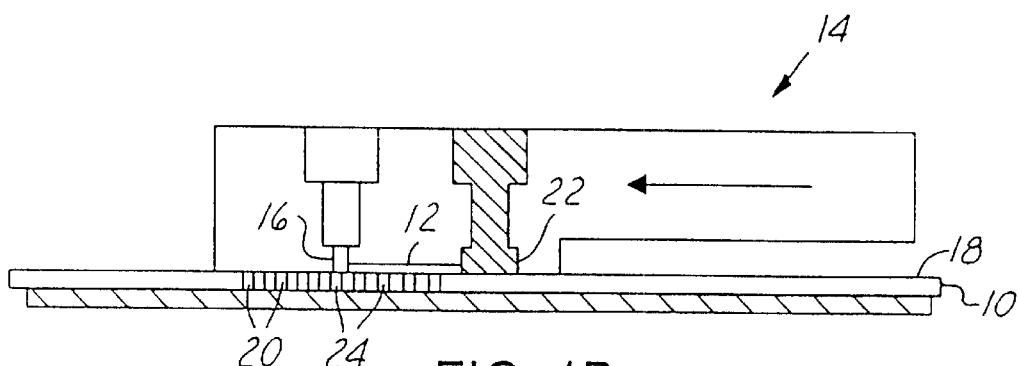
Figure 1C:
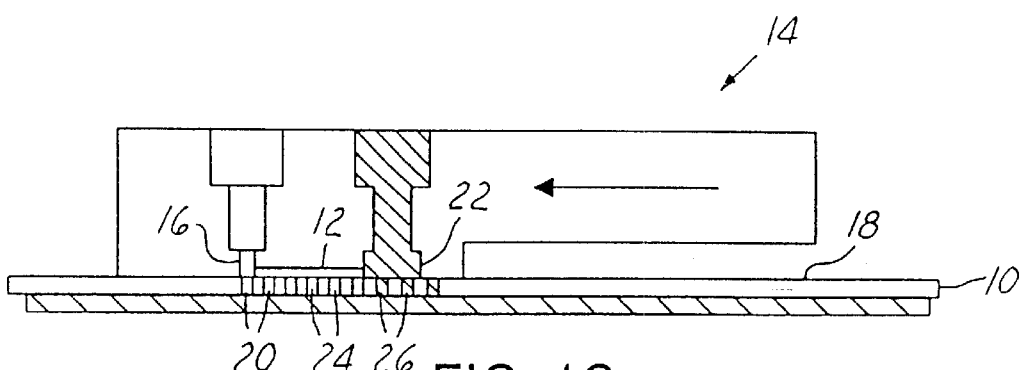
Figure 1D:
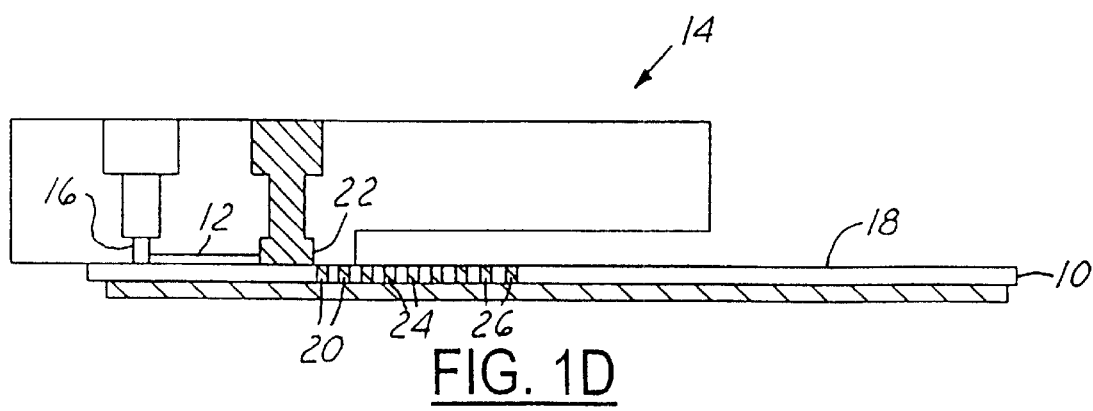
Figure 2:
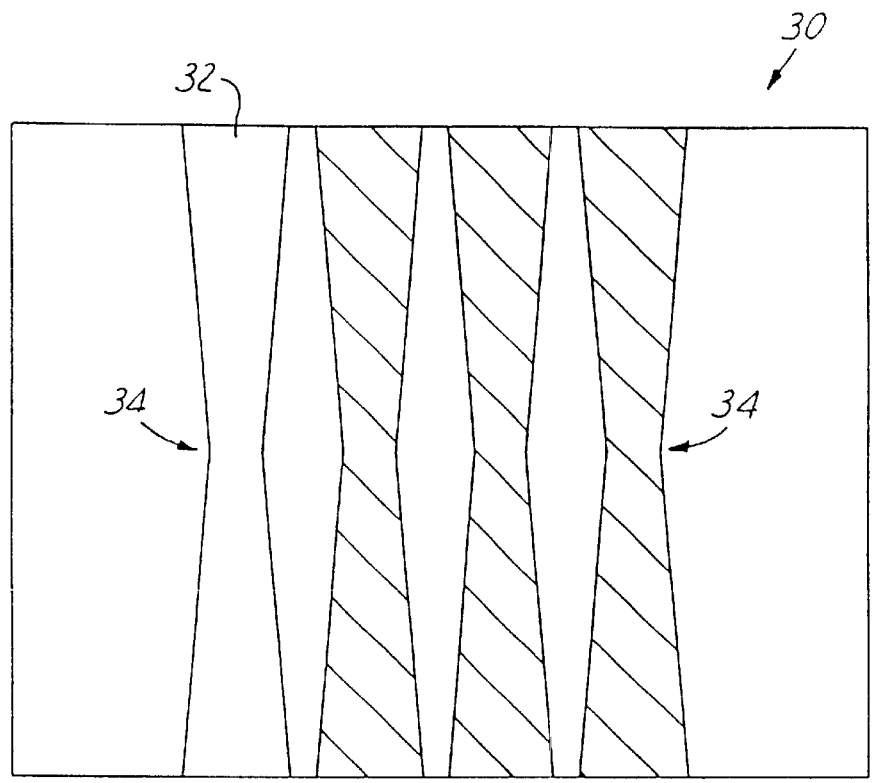
FIG. 2 is an enlarged, cross-sectional view of a substrate having through holes of 17:1 aspect ratio.

Referring initially to FIG. 2, wherein an enlarged, cross-sectional view of a substrate 30 having via holes 32 with high aspect ratios is shown. It should be noted that the via holes 32 are formed in a tapered or hourglass shape in FIG. 2. However, the present invention novel method is not limited for filling such tapered holes. Holes that have a straight opening may be similarly filled by the present method. As shown in FIG. 2, the narrow center portion 34 of the via hole 32 has a diameter of approximately 30 μm while the spacing between the holes is approximately 20 μm. The via holes 32 has a length of approximately 500 μm and therefore making an aspect ratio of about 17:1. It has been found that while a conventional injection molded solder process may be effective in filling via holes that have aspect ratios up to 5:1 and a hole diameter of larger than 100 μm, the present invention novel method is capable of filling via holes that have aspect ratios between 5:1 and 30:1, and have diameters between about 5 μm and about 125 μm.

Figure 3A:
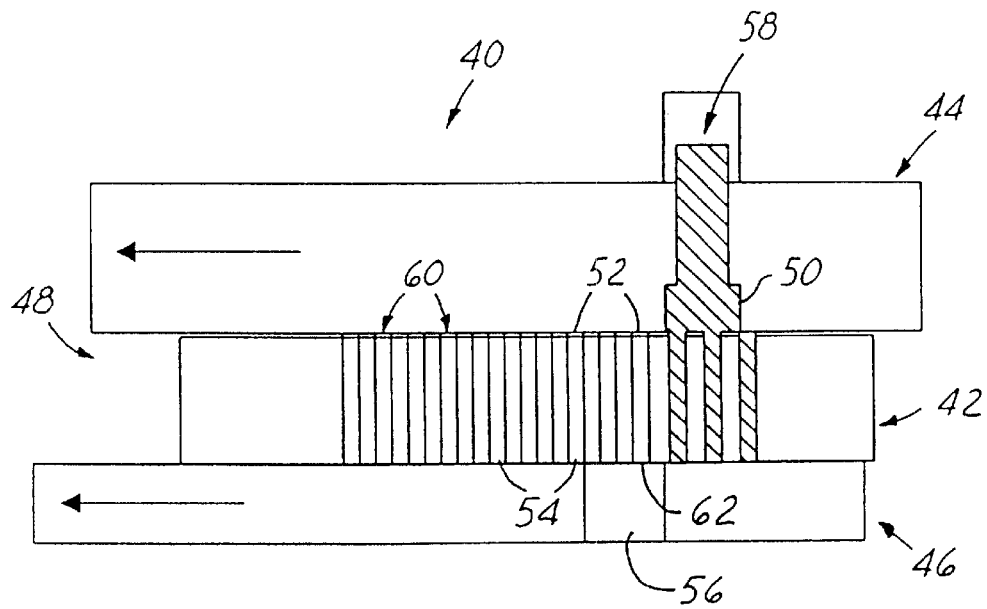
FIGS. 3A–3B are cross-sectional views illustrating the present invention apparatus in operation.
Figure 3B:
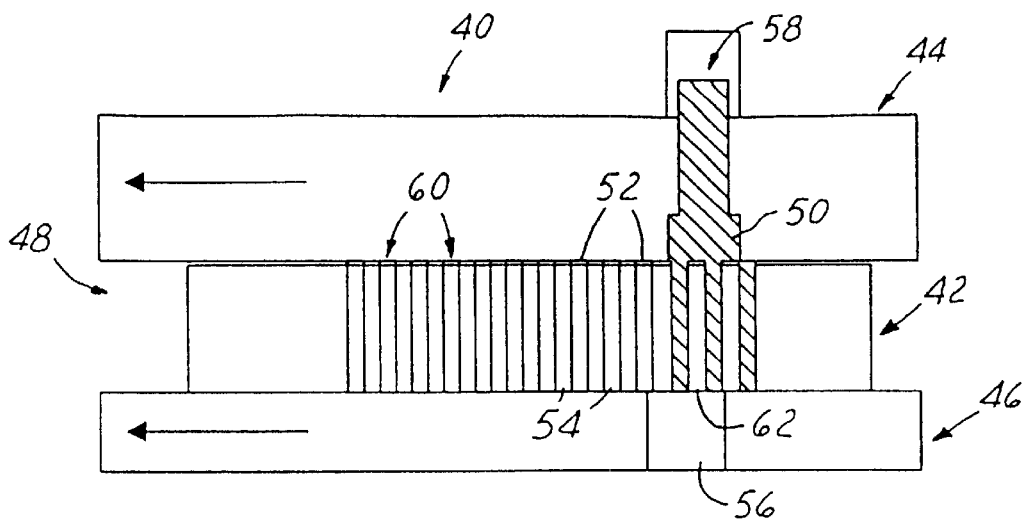

Referring now to FIGS. 3A and 3B wherein cross-sectional views of the apparatus 40 are shown. As can be seen in FIGS. 3A and 3B, the method overcomes the shortcomings of the conventional IMS method by utilizing several novel features. First, there are two supplies, i.e., a vacuum supply and an injection supply that are simultaneous scanned below and above the stationary via array substrate 42. It should also be noted that the set-up shown in FIGS. 3A and 3B is more suited for a laboratory test arrangement. While in a fabrication plant, the filler plate 44 and the vacuum plate 46 are more likely be held in a stationary position while the via array substrate 42 is scanned through a gap 48 formed inbetween the two plates 44, 46. Since the pressurized filler 50 is supplied to a top opening 52 of the via holes 60 while the vacuum is supplied to the bottom opening 54 of the via holes 60, the full pressure differential is produced across the via holes. Since each supply, i.e., the pressure and the vacuum, may be separately adjusted, a wide range of total pressure differentials can be achieved. The wide range of total pressure differential may be further utilized in conjunction with an adjustable veneer position range shown in FIGS. 4A and 4B.

As shown in FIGS. 3A and 3B, the present method allows for the precise positioning of both supplies, i.e., the pressure and the vacuum, relative to each other. For example, FIG. 3A shows the vacuum supply 56 in front of the pressurized filler supply 58 and therefore, in a leading or non-overlapping position. FIG. 3B shows the vacuum supply 56 is only slightly ahead of the pressurized filler supply 58, and thus in a leading and overlapping position. Each of the relative positions has its own unique applications depending on the materials utilized and the geometries of the via holes. A third main position configuration (not shown) is that of the vacuum supply 56 and the pressurized filer supply 58 being at the same position, and thus in an equal and overlapping position. This third position would be suitable for dispensing the highest viscosity filler materials.

The filler plate/vacuum plate configuration shown in FIG. 3A can be suitably used for lower viscosity materials, such as molten solder. In this configuration, there is no overlapping between the scanning vacuum and the pressurized filler supplies. This ensures that the evacuated via holes 60 (shown in shaded sections) back-fill with molten solder 50 without allowing the solder to escape through the vacuum slot 62. Furthermore, the position between both supplies 56, 58 can be precisely preset such that at a certain scanning speed, i.e., between about 25 mm/min and about 250 mm/min, the vacuum does not bleed away before the molten solder fully penetrates the via holes 60. The position setting shown in FIG. 3B, on the other hand, can be suitably used for materials with higher viscosities. In this configuration, there is some overlap between the vacuum and the pressurized filler supplies 56, 58. This permits the greatest pressure differential, depending on each supply setting, to be produced across each via hole 60 for a longer time period. Depending on the scanning speed, this configuration can be used to fill deep via holes with high-viscosity materials such that longer time is available for penetrating the holes. In the configuration shown in FIG. 3B, it is further possible for some of the via filling material 50 to slightly enter the vacuum slot 62 once each via hole is completely filled. However, due to the scanning motion of both the filler and the vacuum supplies 56, 58, this can be kept to a minimum required to confirm complete filling. In effect, the scanning motion essentially "freezes", or confines the filler material 50 within the vias 60 as they are sequentially filled and then sealed by the passing slots.

Figure 4A:
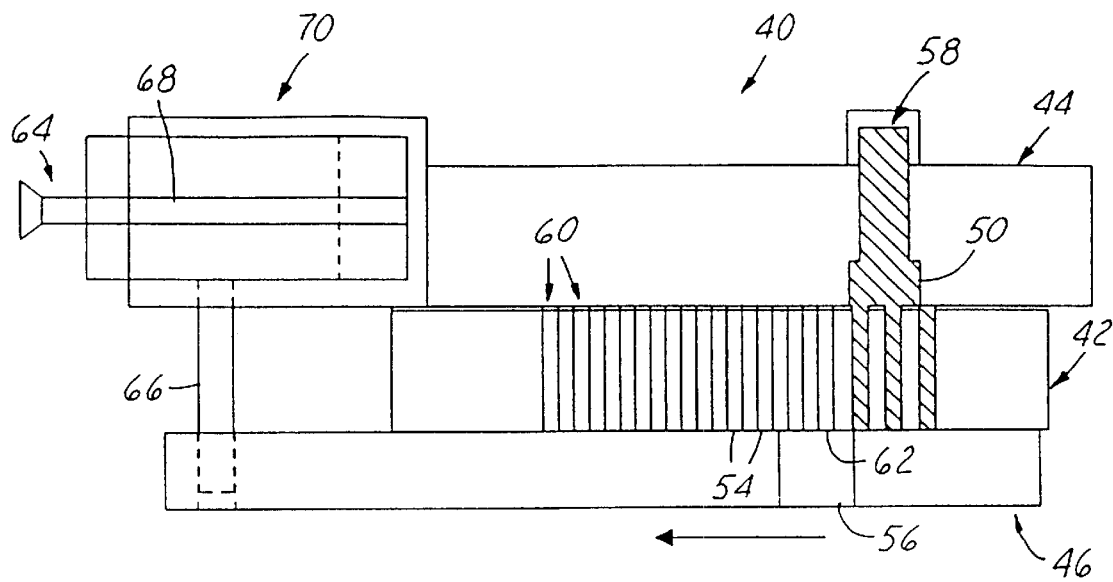
FIGS. 4A and 4B are cross-sectional views of the present invention apparatus further equipped with veneer adjustment means.
Figure 4B:
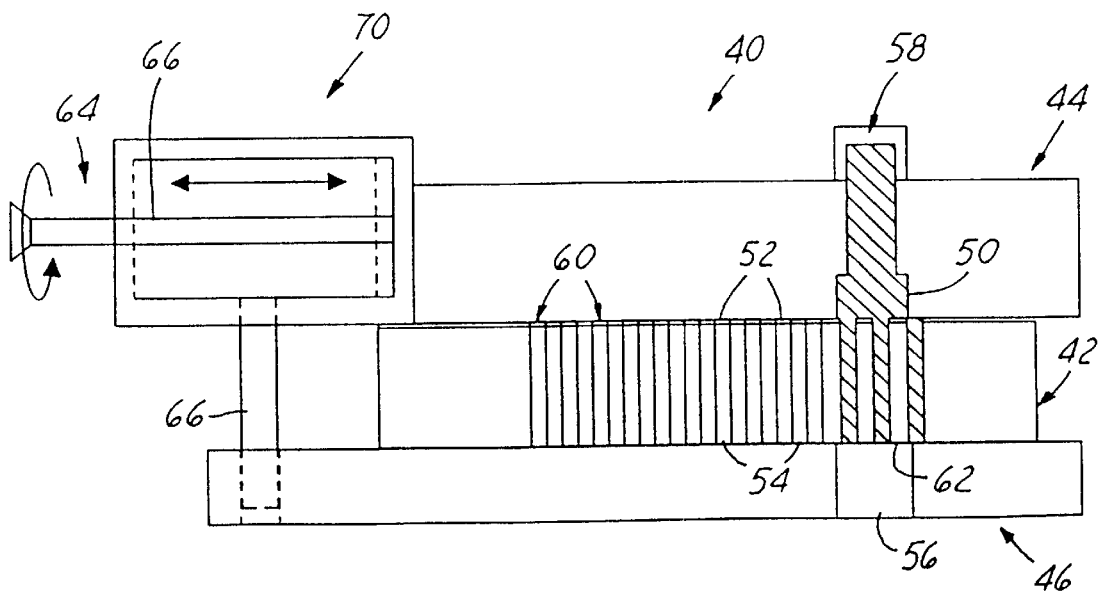

In another configuration shown in FIGS. 4A and 4B, the scanning motion is produced by a mechanical actuator 70 which is connected to the filler supply plate 44 and the motion is transferred to the vacuum supply plate 46 through the engagement pin 66 shown in FIG. 4A. The precise positioning of the via filler supply 50 in reference to the vacuum supply 56 is achieved through a veneer positioning adjustment 64 that locks in the relative positions of the supply plate 44 and the vacuum plate 46. This precise control is another benefit made possible by the present apparatus which can be used to accommodate via filling material 50 of various viscosities.

A threaded veneer rod 68 is utilized in the threaded veneer adjuster 64, shown in FIG. 4A, which when turned transforms a circumferential motion of the veneer rod 68 into a linear displacement motion of the filler plate 44. As a result, a slight change in the vacuum supply plate 46 position and its corresponding vacuum slot 62 from the adjustment position 1 to the adjustment position 2 shown in FIGS. 4A and 4B, respectively. The engagement pin 66 provides a mechanical link between the filler supply plate 44 and the vacuum supply plate 46. Normally both plates move in exact unison as they are scanned in reference to the stationary via array substrate 42. Again, it should be emphasized that in a fabrication plant, it is more convenient and desirable to move the via array substrate 42 while keeping the filler supply plate 44 and the vacuum supply plate 46 in a stationary position. During veneer adjustment, only one plate is adjusted slightly in position with reference to the other plate through the engagement pin 66. It is obvious that the mechanical actuator 70 can be connected to either plate.

Figure 5A:
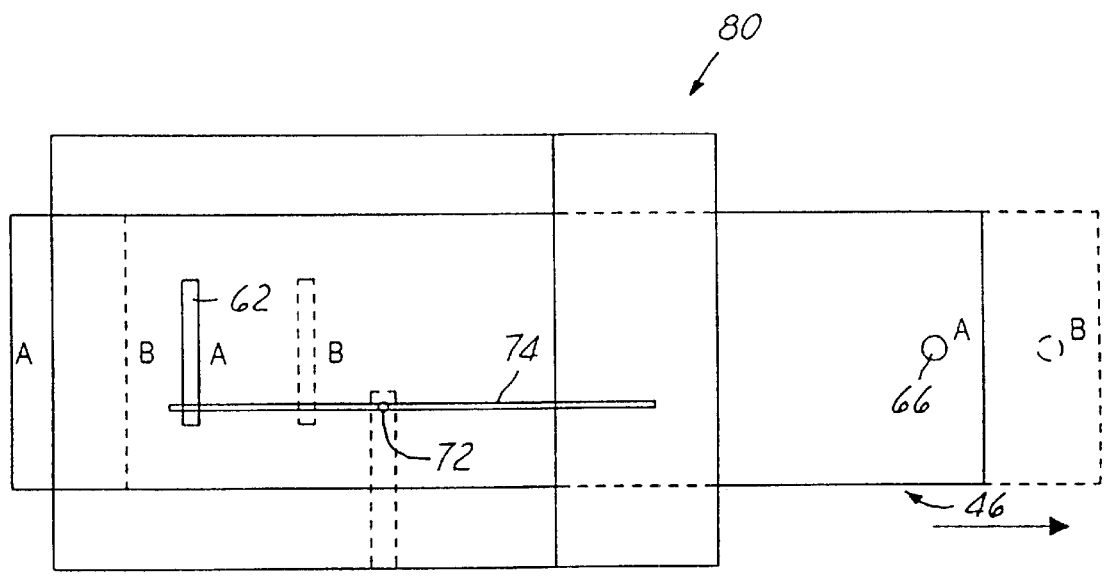
FIGS. 5A and 5B are a plane view and a cross-sectional view of the present invention coating apparatus.
Figure 5B:
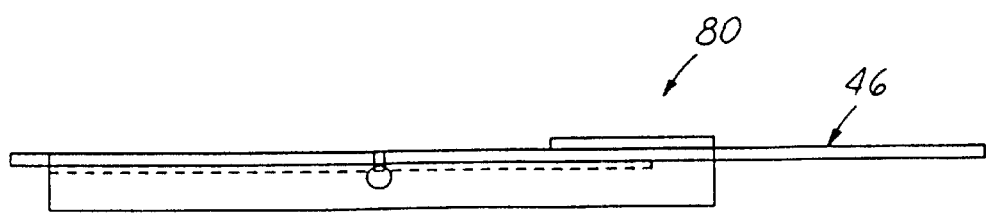

FIGS. 5A and 5B show the fixturing 80 that is required to supply a movable vacuum slot 62 and a method for assuring that the via array substrate 42 remains stationary during the scanning operation. A vacuum supply port 72 may be connected to a vacuum source through a hose. The vacuum supply port 72 in turn is connected in the fixture to a vacuum supply channel 74, while the top surface of which is exposed. The movable vacuum plate 46 covers the vacuum supply channel 74 except for the area of the vacuum slot 62. This enables the scannable vacuum slot 62 as a continuous vacuum source that is readily available. It should be noted that while FIGS. 5A and 5B show one specific embodiment of the vacuum plate/filler plate/via array substrate arrangement, it is not intended to limit the scope of the present invention novel apparatus and method.

While the present invention novel apparatus and method can be used to fill any type of substrates that are provided with high aspect ratio holes, it is particularly suited for filling deep, high aspect ratio via holes in substrates such as glass, silicon, plastic laminates, etc. Typical uses of via holes in these substrates include providing electrically conductive paths from one side of the substrate to the opposite side of the substrate. Such a suitable substrate may be glass when used in a display panel application. When the substrates are silicon, they can be used to fabricate integrated circuits for processors and memory devices. Substrates that are made of plastic laminates are typically used for making high performance (multiple conductive layers separated by insulating layers) carriers that support silicon devices. In such applications, the combination of silicon device mounted on a high performance carrier results in an electronic package that can be utilized in many applications, such as PC's, telecommunications, electronic modules for automobiles, etc.

Figure 6A:
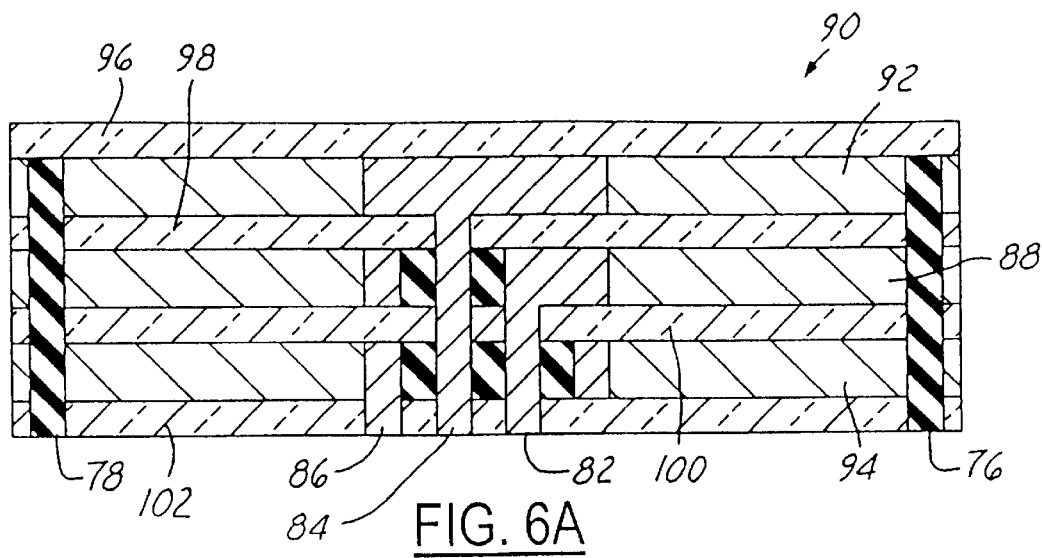
FIGS. 6A and 6B are a cross-sectional view and a plane view of a interconnect in a liquid crystal display panel formed by the present invention method.
Figure 6B:
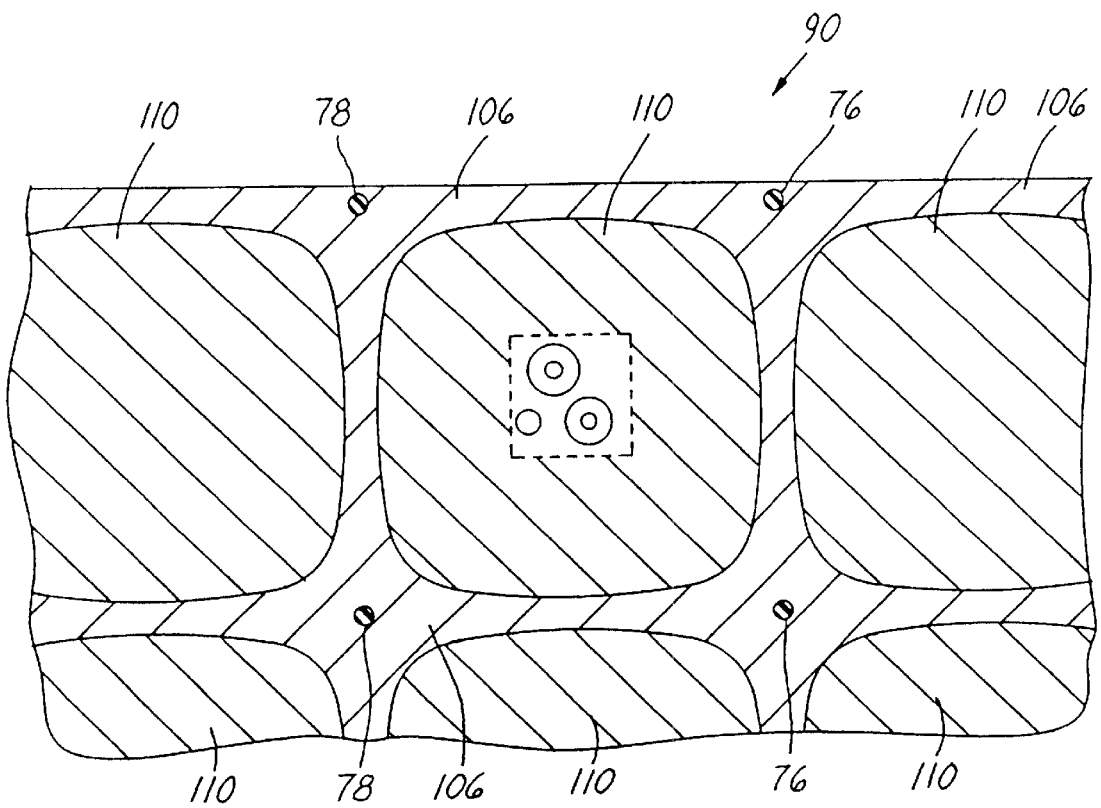

FIGS. 6A and 6B illustrate a cross-sectional view and a plane view of interconnects, respectively in a liquid crystal display panel 90 formed by the present invention method. The interconnects formed include that for the ground conductors 76, 78 and that for the blue, green and red regions 82, 84 and 86 in the liquid crystal display panel 90, respectively. The interconnects 82, 84 and 86 provide a voltage potential on the pixel display elements blue, green and red in the liquid crystal layers 88, 92 and 94, respectively. It is seen in FIG. 6A that the liquid crystal layers 88, 92 and 94 are separated by glass plates 96, 98, 100 and 102, respectively.

The plane view of the liquid crystal display, shown in FIG. 6B, illustrates a plurality of pixels 110 each including the blue, green and red regions that are powered by the interconnects 82, 84 and 86 formed by the present invention novel method. The ground conductors 76, 78 are connected to the ground plane 106. It should be noted that FIGS. 6A and 6B merely illustrate one possible embodiment of a display panel that has interconnects formed by the present invention novel method. The invention may be equally advantageously applied to other possible configurations of interconnects utilized in other types of display panels, i.e, field emission display panels, electro-reflective display panels, etc.

Figure 7A:
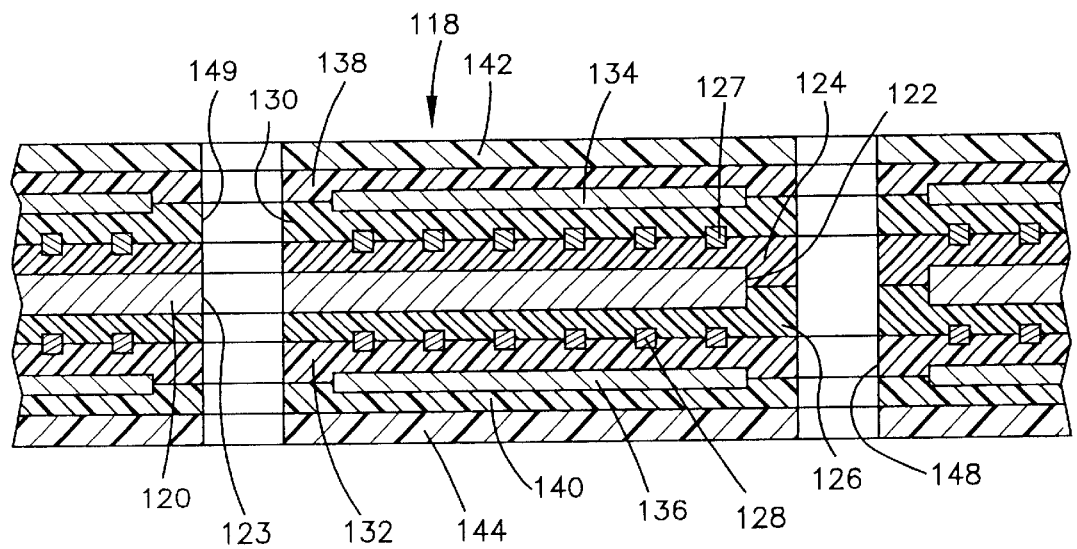
FIGS. 7A through 7H show sequentially some of the steps in forming a high performance chip carrier having metal filled and metal capped plated vias.

Referring now to FIGS. 7A–7H, certain of the steps are shown in forming a high performance chip carrier having metal filled and metal capped plated through holes or vias. The substrate as shown in FIGS. 7A–7H is shown as a 2S3P core (two signal planes, three power planes) with two additional external circuit planes, sometimes referred to as top surface metallization and bottom surface metallization. FIG. 7A shows a substrate 118 just before the plating of the through holes is to take place. While several different dielectric materials can be used as the basis for forming the substrate 118, the preferred and disclosed material is a silica filled polytetrafluoroethylene (PTFE) material, such as that sold by Rogers Corporation under the name "2800-HT", although other dielectric materials could be used, such as polyimide and epoxy filled fiberglass known as FR4. However, for the present use as a high performance chip carrier, silica filled PTFE is preferred. The substrate at the stage of formation as shown in FIG. 7A has been built sequentially by starting with a ground plane 120 which preferably is a 2 mil thick copper-invar-copper (125/75/12.5) material which is etched to form openings, one of which is shown at 122, wherein it is desired to have the vias, which will be formed later, extend through the ground plane 120 without contact therewith, and one of which is shown at 123, wherein the ground plane 120 will contact the conductive via to be formed later. Silica filled PTFE sheets 124 and 126 are laminated to the opposite sides of the ground plane 120 with layers of copper foil on top of the dielectric layers which are personalized to form signal planes 127 and 128. The signal planes 127, 128 are preferably about 12 microns thick. This assembly constitutes the signal core.

Figure 7B:
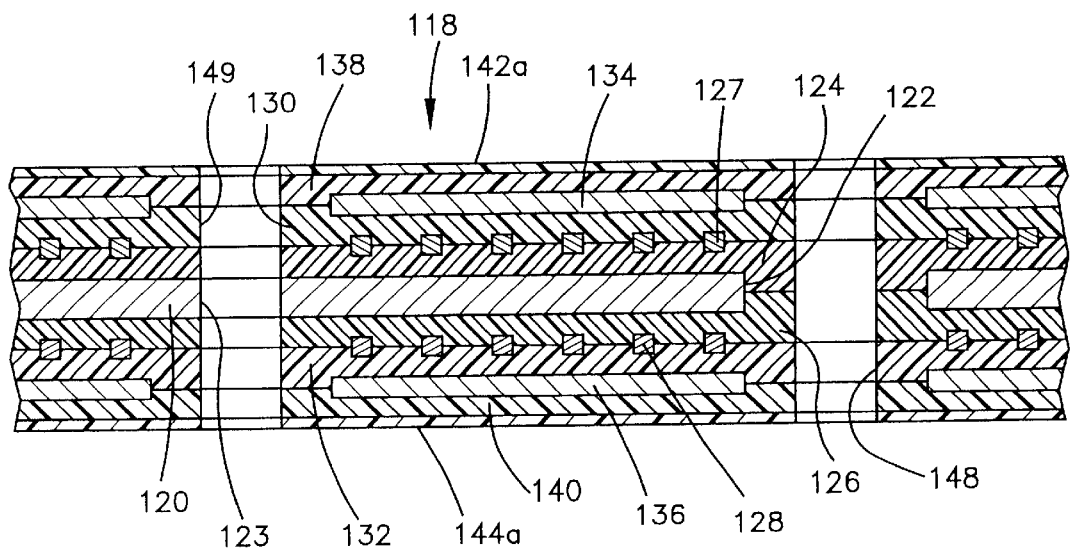
Figure 7C:
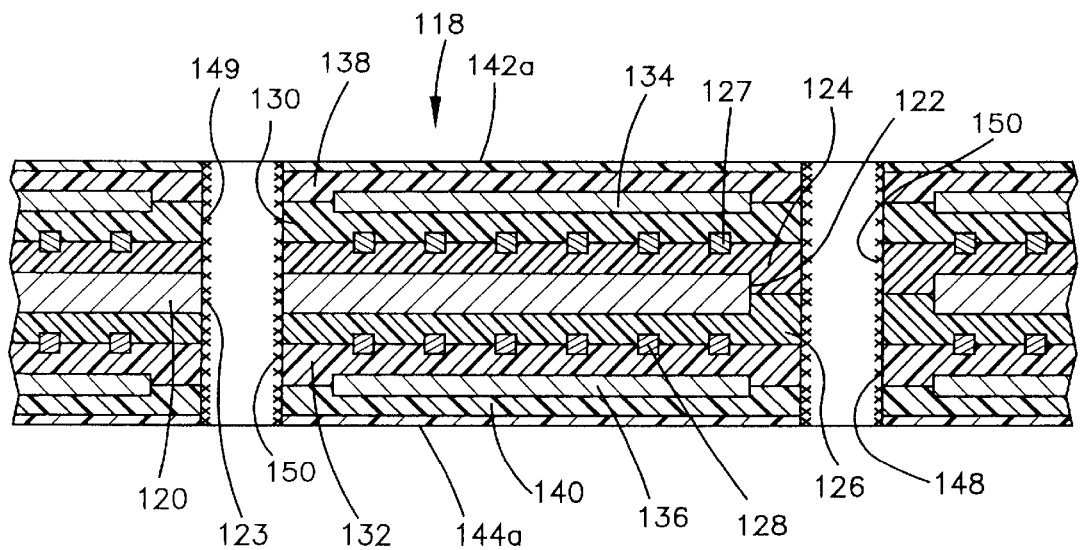

This signal core is then laminated on both sides with layers of preferably 1.4 mil thick silica filled PTFE 130 and 132. On top of the layers 130 and 132 are power planes 134 and 136 which are formed preferably from layers of copper foil 12 microns thick. The power planes are formed by circuitizing the copper layers 134, 136, which structure then constitutes the power core. The power core is then subsequently laminated with additional layers of silica filled PTFE 138 and 140, each of which has on its surface thereof a layer of copper foil 142 and 144. The substrate is about 15 mils thick. The surfaces of foil 142 and 144 are then thinned, preferably by an etching process known as fluid head etching, as described in U.S. Pat. No. 6,222,136, issued Apr. 24, 2001, entitled "Printed Circuit Boards with Continuous Connective Bumps", which is hereby incorporated by reference. This results in a thinning of the copper foil to a very thin copper film 142a and 144a, as shown in FIG. 7B.

At this point in construction, all through holes or openings or vias 148, 149 at the required locations are drilled entirely through the substrate 118. The required vias or through holes 148, which will not allow this ground plane 120 to contact a later filled via and holes 149 which will allow the ground plane to control later filled vias, are drilled through the entire thickness of the substrate 118. These holes are typically 1.5 to 2 mils in diameter.

Following the drilling of the holes, the openings or holes 148, 149, as well as the surfaces of the copper foil 142a, 144a, are seeded with a seed material, such as a PdSn colloidal seed sold by the Shipley Corporation for Electroless plating, which provides the necessary basis for electroless plating in the holes 148, 149. (Of course, the seeding on foils 142a, 144a is superfluous.) This seed material in the holes 148, 149 is shown at 150 in FIG. 7C.

Figure 7D:
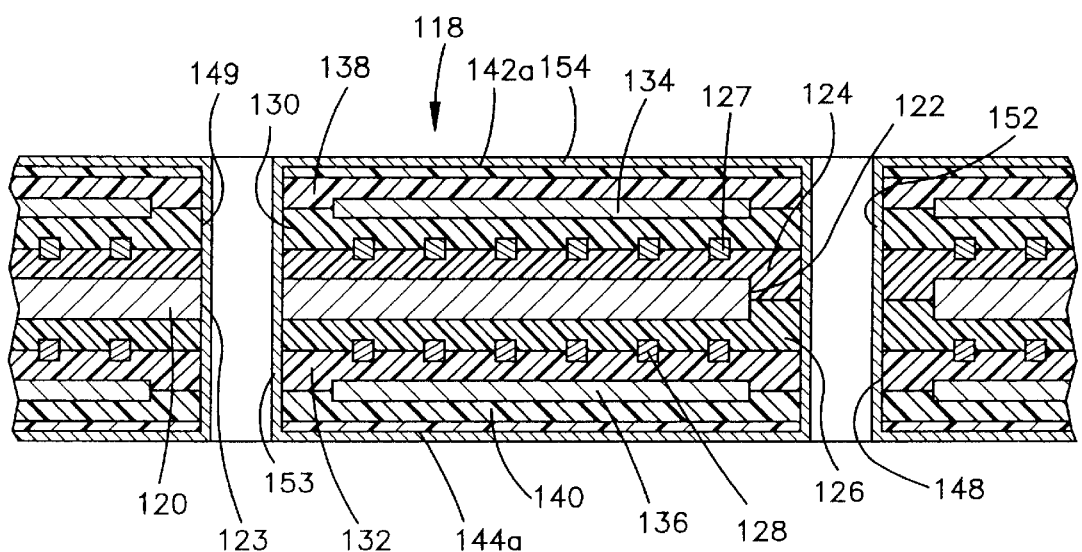

Following the seeding, and as shown in FIG. 7D, copper is electroplated, which results in a copper plating 152 in the opening 148, and copper plating 153 in opening 149, as well as copper plating 154 and 156 on the surfaces of the copper foil 142a and 144a, respectively. The thickness of the copper plating 152 within the opening 148 is about 0.3 to about 0.5 mil thick. Thus, the holes have an aspect ratio of between about 5:1 and 30:1, typically about 7:1 and a diameter of between about 5 µm and 100 µm, typically about 37 µm.

Figure 7E:
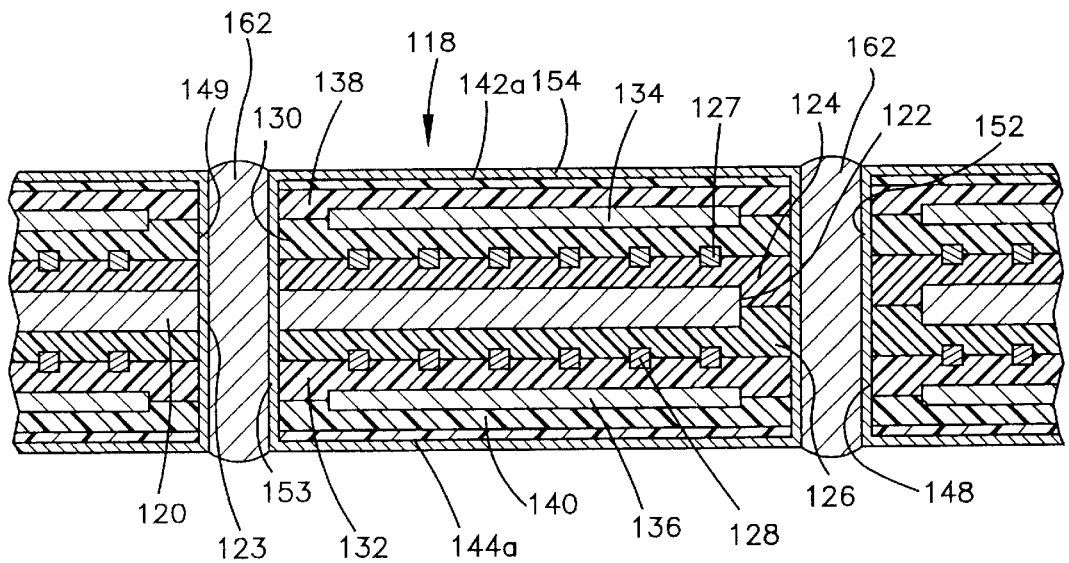

At this point in the processing of the substrate, the plated holes 148, 149 are filled with a liquid conductive material 162, such as a solder or a liquid conductive epoxy, by the apparatus and method as described previously herein. The solder may be any conventional solder. The filling process of the holes 148, 149 utilizing the apparatus previously described provides a vacuum at one end of the openings 148, 149 and a pressure fill at the opposite end of the openings 148, 149, all as previously described herein. High melting point solder is preferred as the filling, but not required. For example, eutectic solder can be used. Although solder is the preferred filling material, it is contemplated that other conductive liquids that would solidify at room temperature may be used, such as Ablestik's Ablebond 8175, DuPont's CB-100, and Multicore Polymet 100. The Ablebond 8175 and CB-100 are silver filled thermoset polymer, and Polymet 100 is a Sn/Cu filled thermoset polymer. The structure at this point is shown in FIG. 7E. It is to be understood that the formation of the filled and plated vias as shown herein and as presently contemplated relies on the filling technique described herein.

Thus, what is formed are drilled vias or plated through holes having an aspect ratio of greater than 5:1, and preferably between 5:1 and 30:1, and having a diameter of less than about 125 microns, preferably between about 5 microns and 125 microns, and more preferably between 5 microns and 100 microns.

Figure 7F:
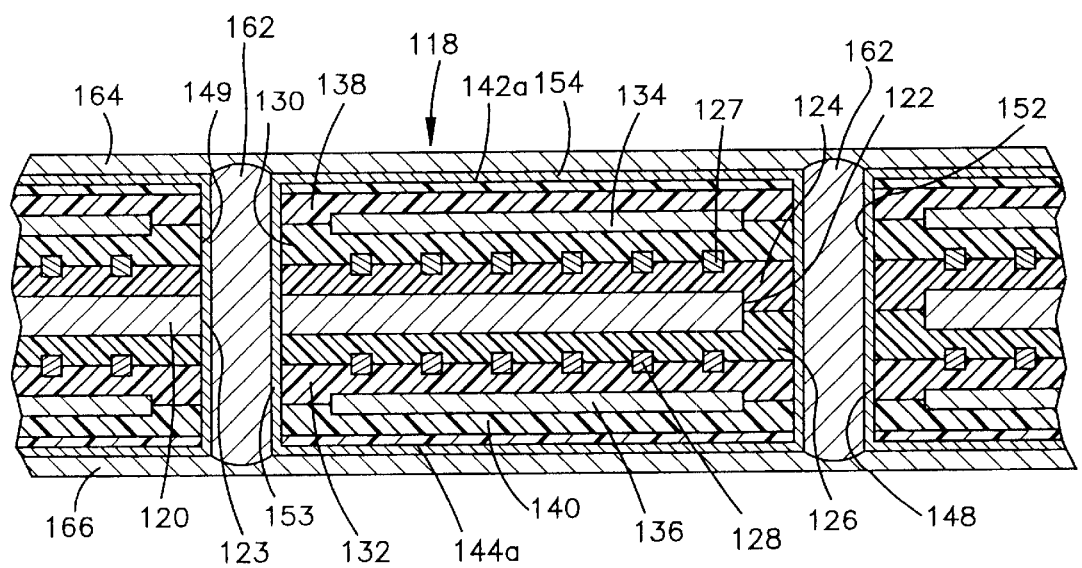

Following the filling of the plated through holes 148, 149, copper is electroplated on both sides of layers 142a and 144a which forms continuous plating layers 164 and 166 and covers the fill 162 in the plated openings 148, 149. This is shown in FIG. 7F. Following the plating of the layers 164 and 166 these two layers, as well as underlying layers 142a and 144a, are circuitized as shown at 168 and 170 which provides circuitization, including caps, over the fill material 162 is shown in FIG. 7G.

Figure 7G:
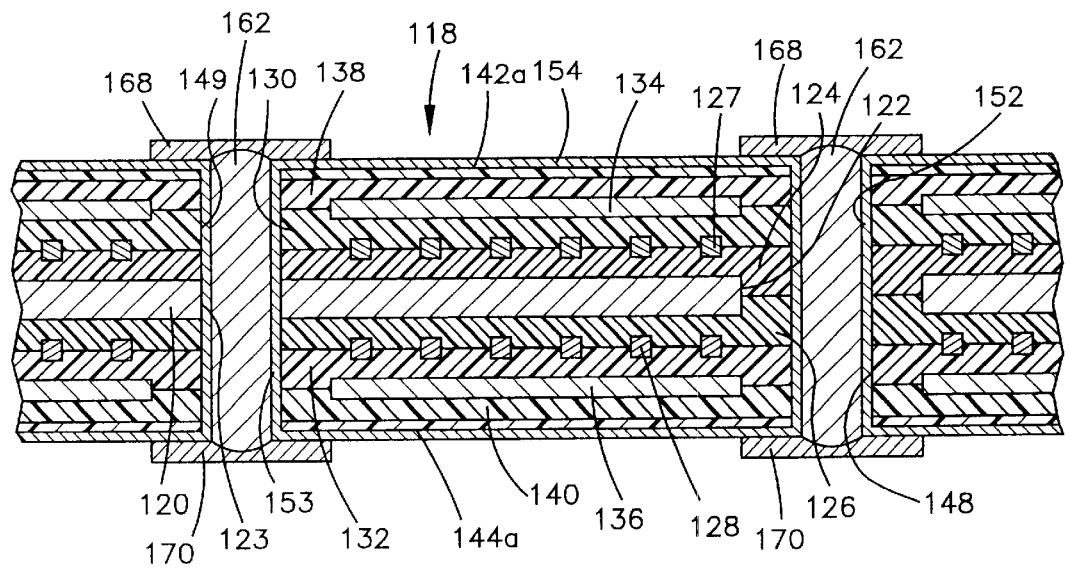
Figure 7H:
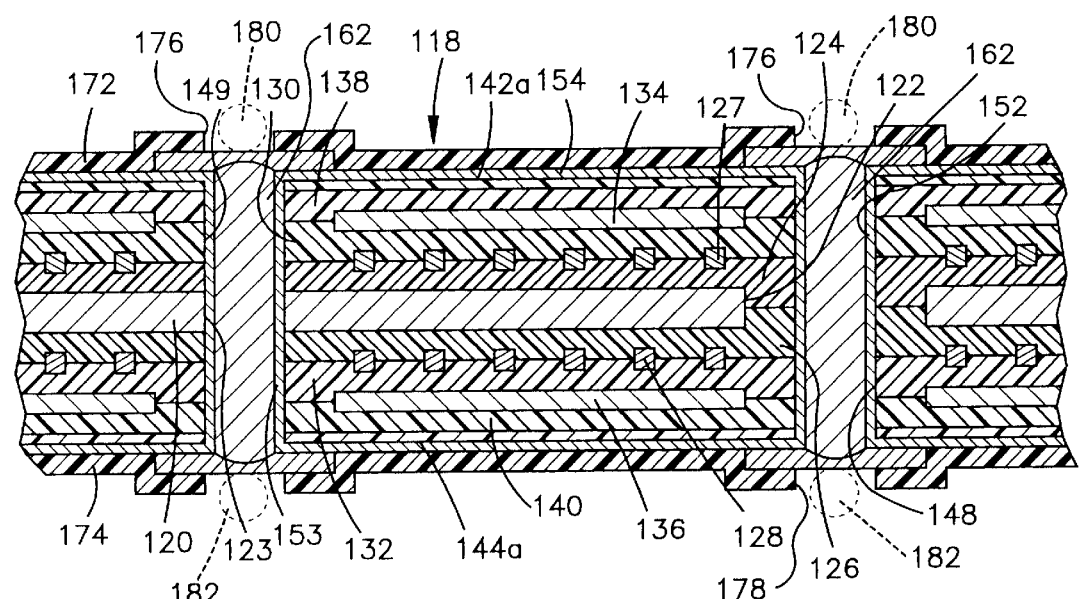

Following the circuitization and forming of the caps as shown in FIG. 7G, in order to complete the structure for attachment to a chip and a substrate, soldermask material 172 and 174 is provided on opposite sides of the opening over the circuitization 168 and 170. This soldermask material may be a photoimageable material of the type disclosed in U.S. Pat. No. 5,026,624 to Day et al. The soldermask material is exposed and developed to form openings 176 and 178 in the material 172 and 174, respectively. The openings 176 provide for attachment of C4 joints (solder balls) shown in phantom outline at 180 and ball grid array solder attachments 182 as shown in phantom in opening 178.

As an alternative to the photoimaged soldermask 172, 174, a soldermask material, such as a copper/resin laminate sold by Asahi Company under the designation PCC-5103, can be used. In this case, the copper coated resin is affixed to the top and bottom surfaces, laser drilled to form blind vias, plated and etched to form the structure, as shown in FIG. 7I, with a resin coating 190, blind vias 192, having plating 194. The blind vias serve as connectors for the C4 ball grid array connections.

Figure 7J:
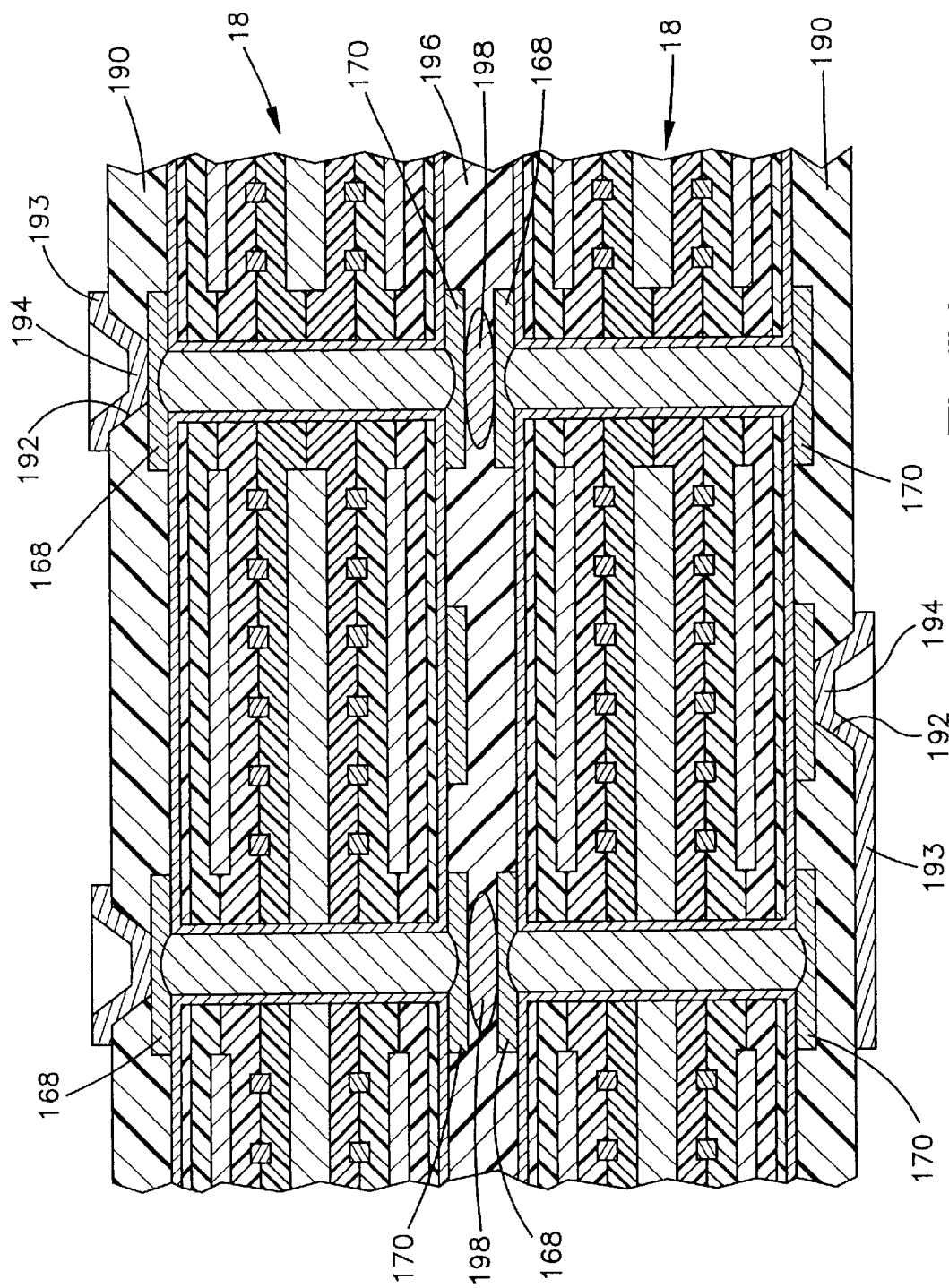
FIG. 7J shows two substrates joined to increase wiring density.

If desired, several of the substrates formed according to this invention can be stacked in superimposed relationship to form a chip carrier with increased wiring density, as shown in FIG. 7J. In this case, a dielectric adhesive sheet 196 is punched or otherwise formed with openings corresponding to cap 168 in adjacent substrate 118. Solder or conductive paste 198 is applied on the caps 168 of one of the substrates 118 and the two substrates 118 are laminated together, as shown in FIG. 7J.

It is to be understood that the high performance chip carrier is preferably formed with plated through holes as described. However, the substrate can be formed without plating the openings 148, but merely filling them with the conductive liquid and letting the liquid solidify. In this case, the plating step is omitted, as well as the seeding step, and the filling is done immediately after the drilling. In this case, the fluid head etching may also be omitted. In any event, the filling is done using the apparatus and the technique described previously herein.

While the present invention has been described in an illustrative manner, it should be understood that the terminology used is intended to be in a nature of words of description rather than of limitation.

Furthermore, while the present invention has been described in terms of a preferred and two alternate embodiments thereof, it is to be appreciated that those skilled in the art will readily apply these teachings to other possible variations of the invention.

The embodiment of the invention in which an exclusive property or privilege is claimed are defined as follows:

What is claimed is:

1. A dielectric substrate having opposed faces and at least one hole extending completely therethrough from one face to the other, having an aspect ratio of between about 5:1 and 30:1 and diameter at its narrowest point of from about 5 μm to about 125 μm;

said hole having a solidified conductive liquid disposed therein extending from one end of said hole to the other end of said hole; and wherein said at least one of said liquid filled hole has a separate, electrically conductive cap thereon.

2. The invention as defined in claim 1 wherein said hole includes a plating on the surface thereof of an electrically conductive material surrounding said solidified liquid material.

3. The invention as defined in claim 2 wherein said dielectric substrate has at least one internal electrically conducting plane in electrical contact with said electrically conductive material.

4. The invention as defined in claim 1 wherein said dielectric substrate has at least one internal electrically conducting plane in electrical contact with said solidified conducting material.

5. The invention as defined in claim 1 wherein said hole is tapered.

6. The invention as defined in claim 5 wherein said hole is generally hourglass shaped.

7. The invention as defined in claim 1 wherein said substrate includes at least two internal power planes.

8. The invention as defined in claim 7 wherein said substrate is a power core and said cap is a connector pad.

9. A dielectric substrate having opposed faces and at least one hole extending completely therethrough from one face to the other, having an aspect ratio of between about 5:1 and 30:1 and diameter at its narrowest point of from about 5 μm to about 125 μm;

at least one internal electrically conductive plane in said substrate;

said at least one hole having a solidified conductive liquid disposed therein extending from one end of said hole to the other end of said hole;

electrically conductive plating on at least one hole surrounding said solidified material; and each end of each of said filled hole having an electrically conductive cap thereon on the respective face of said substrate.

10. The invention as defined in claim 9 wherein said substrate is connected by electrically conducting connections at one of said end cap to a second structure.

11. The invention as defied in claim 10 wherein said second structure is an I/C chip.

12. The invention as defined in claim 10 wherein said second structure is a second substrate.

13. The invention as defined in claim 9 further characterized by a soldermask on at least one face of said substrate.

* * * * *